United States Patent [19]

Nagarajan et al.

[11] Patent Number: 5,760,939
[45] Date of Patent: Jun. 2, 1998

[54] OPTICAL TRANSMISSION LINK CAPABLE OF HIGH TEMPERATURE OPERATION WITHOUT COOLING WITH AN OPTICAL RECEIVER MODULE HAVING TEMPERATURE INDEPENDENT SENSITIVITY PERFORMANCE AND OPTICAL TRANSMITTER MODULE WITH LASER DIODE SOURCE

[75] Inventors: Radhakrishnan Nagarajan, Union City; Jo S. Major, Jr., San Jose, both of Calif.

[73] Assignee: SDL, Inc., San Jose, Calif.

[21] Appl. No.: 546,852

[22] Filed: Oct. 23, 1995

[51] Int. Cl.$^6$ .................................................. H04B 10/00
[52] U.S. Cl. .......................... 359/161; 359/163; 359/180; 372/34
[58] Field of Search ......................... 359/180, 181, 359/187, 188, 189, 194, 195, 163, 161; 372/45, 34

[56] References Cited

U.S. PATENT DOCUMENTS

| | | | |
|---|---|---|---|
| 4,029,976 | 6/1977 | Fish et al. | 307/311 |
| 5,012,162 | 4/1991 | Chun | 315/309 |
| 5,251,225 | 10/1993 | Englash et al. | 372/45 |
| 5,381,434 | 1/1995 | Bhat et al. | 372/45 |

FOREIGN PATENT DOCUMENTS 666 624 A  8/1995  European Pat. Off.  ......... H01S 3/19

OTHER PUBLICATIONS

R. Nagarajan et al., "Data-Link Components Meet Satellite Requirements", *Laser Focus World*, p. 117 et seq., Nov., 1996.

J. Krawczak "Wide Temperature Digital Fiber Optic Transmitters and Receivers for High Bandwidth Military Applications" Proceedings of IEEE 1992 Natl. Conf., NAECON 1992, pp. 1179–1185.

Sagawa et al. "High-Power Highly Reliable Operation of 0.98 micronmicron In GaAs–InGaP Strain Comp Single, etc.", IEEE Journ. of Selected Topics in Quantum Electronics, Jun. 1, 1995, vol. 1, No. 2, pp. 189–191.

*Primary Examiner*—Wellington Chin
*Assistant Examiner*—Rafael Bacares
*Attorney, Agent, or Firm*—W. Douglas Carothers, Jr.

[57] ABSTRACT

An optical transmission link has both a transmitter module and a receiver module operable under uncooled conditions, i.e., without the need of costly cooling equipment, such as thermoelectric coolers. The optical transmission system includes both a semiconductor laser diode source and an optical receiver module that are both designed to operate uncooled under high frequencies (e.g., GHz range) over a wide temperature range without significant changes in signal bandwidth and at temperatures in excess of 125° C. Compensation is provided to reduce the effect of photodiode noise and amplifier noise. In addition, temperature compensation can be provided that provides for overall reduction in receiver noise across the bandwidth of the receiver module through maintenance of a temperature environment optimizing receiver performance.

12 Claims, 4 Drawing Sheets

OPTICAL TRANSMISSION LINK CAPABLE OF HIGH TEMPERATURE OPERATION WITHOUT COOLING WITH AN OPTICAL RECEIVER MODULE HAVING TEMPERATURE INDEPENDENT SENSITIVITY PERFORMANCE AND OPTICAL TRANSMITTER MODULE WITH LASER DIODE SOURCE

The invention was supported under Government Contract No. (Prime) F3365788-C-4280, Subcontract No. A010. The government has certain rights in the invention.

BACKGROUND OF THE INVENTION

The present invention relates generally to optical communication or transmission link or system and, more particularly, to the uncooled operation of fiber optic communication link operable at high temperatures and having an optical receiver module with reduced noise bandwidth over a wide operating temperature range.

Optical communication or transmission systems basically comprise an optical transmitter module coupled to an optical transmission medium, such as an optical fiber, which is coupled to an optical receiver. The optical transmitter module contains a laser diode source and its circuit driver for intensity modulation of the source according to the data to be transmitted over the link. Typically, the optical signal is received at the optical receiver module where the signal is converted by a photodetector into an electrical current signal which is thereafter preamplified and, then, post-amplified. The receiver module is an important component in the data communication link since this is where noise has the greatest detrimental effect. The general aim in the design of these optical transmission systems is to optimize the signal bandwidth and minimize noise relative to a given data bit rate, but these factors are limited by the performance of the optical receiver module. Thus, in attempting to improve the signal-to-noise (SNR) performance, there are conflicting requirements for wide bandwidth and low noise generation. Therefore, it is of general desirability in system design to achieve extended receiver bandwidth without increasing the total noise.

Typical laser diodes employed in an optical transmitter have high junction temperatures, such as above 800° C., so that it is necessary to provide for their effective cooling; otherwise, they will self-destruct in a short period of time. The cooling is generally accomplished by the use of thermoelectric coolers. However, these coolers are a major cause of failures in packaged laser transmitters. Such failures cannot be tolerated in many applications, such as in the case of satellite communications. Typically these coolers require 4 W of power for each watt of thermal power removed which is a major power consumption. They can typically lower the temperature of the laser diode by as much as 45° C. However, this clearly is not sufficient for optical transmitter modules required to operate at temperatures in excess of 100° C. Furthermore, at these high temperatures, these coolers tend to delaminate due to the low melting temperature solder employed in their manufacture. Therefore, for high temperature operational environments, the use of thermoelectric coolers is not practical. The use of uncooled laser diodes as well as compatible receiver modules at high environmental operating temperatures, such as in excess of 80° C., is desired because it eliminates the requirement for thermoelectric coolers which add additional complexity and cost to the optical transmission link package due to the necessity of additional power supplies, temperature sensors and controllers.

There has been recent efforts to provide for laser diode sources that do not require cooling during operation, i.e., sources that can operate at high temperatures without with any cooling assistance, such as disclosed in the articles C. E. Zah et al., "High Performance Uncooled 1.3 μm $Al_xGa_yIn_{x-y}As$/InP Strained Layer Quantum Well Lasers for Subscriber Loop Applications", *IEEE Journal of Quantum Electronics*, Vol. 30(2), pp. 511–523 (1994); B. Stegmuller et al., "High Temperature (130°) CW Operation of 1.53 μm InGaAsP Ridge Waveguide Laser Using Quaternary Quantum Wells", *Electronic Letters*, Vol. 29(19), pp. 1691–1693 (1993), R. Nering "Uncooled Laser Transmitter Maintains High Performance", *Laser Focus World*, Vol. 28(10), p. 85 et seq. (October, 1992) and P. L. Derry et al., "Low Threshold Current High Temperature Operation of InGaAs/AlGaAs Strained Quantum Well Lasers", *IEEE Photonies Techn,ology Letters*, Vol. 4(11), pp. 1189–1191 (1992). However, no known consideration has been given for providing a complete fiber optic data link or other optical transmission system capable of either operating uncooled at temperatures well in excess of room temperature, i.e., operating under high temperature conditions without the requirement of cooling while improving performance and operative over a bandwidth which is fairly independent of temperature over a wide range. This is particularly important where operation of the optical receiver is in an environment where low noise operation over a wide operating temperature range is a critical factor as well as insensitivity to very high levels of radiation, such as in the case of satellite communications.

Therefore, it is an object of this invention to provide a complete uncooled optical communication or transmission link comprising both an uncooled optical transmitter and an uncooled optical receiver module achieving constant sensitivity over a broad operating temperature range.

It is another object of this invention to provide a laser diode source that can operate uncooled under environmental temperatures in excess of 80° C. eliminating the necessity, cost and unreliability of thermoelectric coolers.

It is another object of this invention to provide an optical receiver module in an optical communication or transmission system that has improved performance through reduction of receiver noise over a wide range of operating temperatures.

It is a further object of this invention to provide an optical receiver module that provides for improved performance by reduction in receiver noise over a wide operating bandwidth through imposition of a higher operation temperature of the receiver module.

SUMMARY OF THE INVENTION

According to this invention, an optical transmission link having both a transmitter module and a receiver module operate under uncooled conditions, i.e., without the need of costly cooling equipment, such as thermoelectric coolers. Moreover, the optical receiver module in the optical transmission link can operate uncooled over a wide temperature range without significant changes in sensitivity and bandwidth as well as operate at temperatures in excess of 100° C.

The optical transmission link of this invention comprises an optical transmitter and receiver module that includes active optical components that are capable of operating at temperatures in excess of room temperature, in particular, temperatures above 80° C. and, more particularly, at temperatures in excess of 125° C. without the requirement of any applied cooling. It is believed, as of this time, that such an uncooled optical transmission link package capable of operating at temperatures in excess of 125° C. has not been successfully achieved. As earlier indicated, the receiver module is an important component in a data communication or optical transmission link since this is where noise has a greatest detrimental effect. The receiver module utilized in this invention provides for uncooled operation at temperatures in excess of 125° C. while improving performance through the reduction of receiver noise. In particular, compensation is provided for the noise, present in the receiver to improve optical transmission link SNR performance and sensitivity over a wide temperature range, including high operating temperatures well in excess of room temperature, over a wide operable receiver bandwidth. The optical receiver module in an optical communication system comprising this invention includes a photodetector, in particular a Schottky photodiode, for producing an electrical current signal, based upon a received optical signal, and is connected to a transimpedance amplifier for amplifying the current signal to an acceptable signal level. Compensation is provided in the receiver module for reducing noise over the acceptable bandwidth of the amplifier, independent of the temperature, over a wide temperature range of operation. This noise is from the transmitter module in the form of laser intensity noise, from the receiver module photodetector in the form of dark current noise, and from receiver module transimpedance amplifier in form of electronic noise. Over the frequency range desired of the optical transmission link, these noise sources are considered to be "white", i.e., the spectral density of noise is substantially constant over the bandwidth. This noise is collectively referred to herein as "white noise", and in the case of noise at the output of the receiver module, "receiver noise". Compensation may be in the form of signal coupling between the photodetector and the transimpedance amplifier of the receiver module. Here, the parasitic elements may be varied, such as by changing the length of the electrical connection between the photodiode and transimpedance amplifier of the receiver module.

In the case that high temperature operation of the optical transmission link is required, such in excess of 80° C., or as high as 125° C. to 140° C., or where packaging constraints in the receiver module do not permit short electrical connection, receiver module performance may be improved by reducing the receiver noise by means of elevated temperature operation of the receiver module. This compensation is provided by operating the receiver module in a high temperature environment or by applying heat directly to the receiver module.

Lastly, a compensating device, such as a thermistor may be employed at the output of the transimpedance amplifier.

When the receiver module is in a higher temperature environment or is heated for the purposes of reducing receiver noise, as mentioned above, the transimpedance amplifier bandwidth is reduced. This may be compensated for by employing a thermistor at the transimpedance amplifier output.

Thus, in improving performance over the receiver bandwidth in accordance with all the teachings of this invention, adjustment is made to the parasitic elements in the receiver, in particular the length of the connecting leads between the photodiode and the input of the transimpedance amplifier are adjusted to optimize performance by adjusting the amount of lead inductance to reduce the amount of receiver noise. However, there are package manufacturing tolerance constraints in that these lead lengths may not obviously be adjusted to be shorter than the distal length between the photodiode and the transimpedance amplifier (packaging so that the photodiode is positioned closer to the amplifier provides some additional and undesirable cost constraints). When further performance improvement is desired, even through package constraints prevent further parasitic element adjustment, the receiver module is heated to improve performance by further reducing total noise over the receiver bandwidth, although the extent of the receiver signal bandwidth may be affected by being reduced a small amount at higher frequencies. The signal bandwidth at higher frequencies can be extended by use of an in-series thermistor at the output of the transimpedance amplifier. Another aspect of this invention is the provision of a laser diode source that is capable of operating uncooled in temperature environments in excess of 80° C., in particular in excess of 100° C. and tested to 140° C. CW operation without failure. Toward this accomplishment, the laser diode source includes a multiple quantum well (MQW), i.e., at least two, if not more, quantum wells in the active region of the laser diode provides for better charge carrier control in the active region and corresponding higher permissible operation temperature. The quantum wells are lattice strained and preferably comprise InGaAs with In greater than 20% to increase the differential gain, to provide for high $T_0$ and lower the laser diode current threshold, $I_{th}$ ($I_{th}=I_0 \exp |T/T_s|$). The barrier layers provide at least 0.2 eV of relative carrier confinement for the quantum well active region. Contact for the laser stripe, e.g., the p-side contact, is patterned to conform to the stripe geometry for reducing the capacitance (C) and resistance (R) of the laser diode source, i.e., its RC time constant, to permit high frequency modulation of the laser diode source in excess of 1 Gb/sec. Preferably the contact is fabricated so that the resulting source capacitance and resistance are respectively less than 10 pf and 10 ω.

A further aspect of this invention is the provision of single transverse mode semiconductor laser diode having a strained multiple quantum well active region comprising at least two strained quantum wells of Group III–V material separated by a barrier layer, the barrier layer characterized by having a thickness of approximately two times thicker than a thickness of one of the quantum wells, each of the quantum wells thinner than a critical thickness established for the Group III–V material comprising a single layer quantum well. The barrier thickness is established by the amount of barrier growth necessary to obtain planarity in the growth for achieving a second quantum well structure having the same physical and electrical properties as the first grown quantum well. Also, if the quantum wells are separated by less than or approximately equal to their thickness, the two combined, closely spaced wells would exceed their critical thickness and defects would result.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 6 is a schematic diagram of an equivalent circuit for the photodiode input circuit in

FIGS. 1–3.

DETAILED DESCRIPTION OF THE PREFERRED EMBODIMENT OF THE INVENTION

Figure 1:
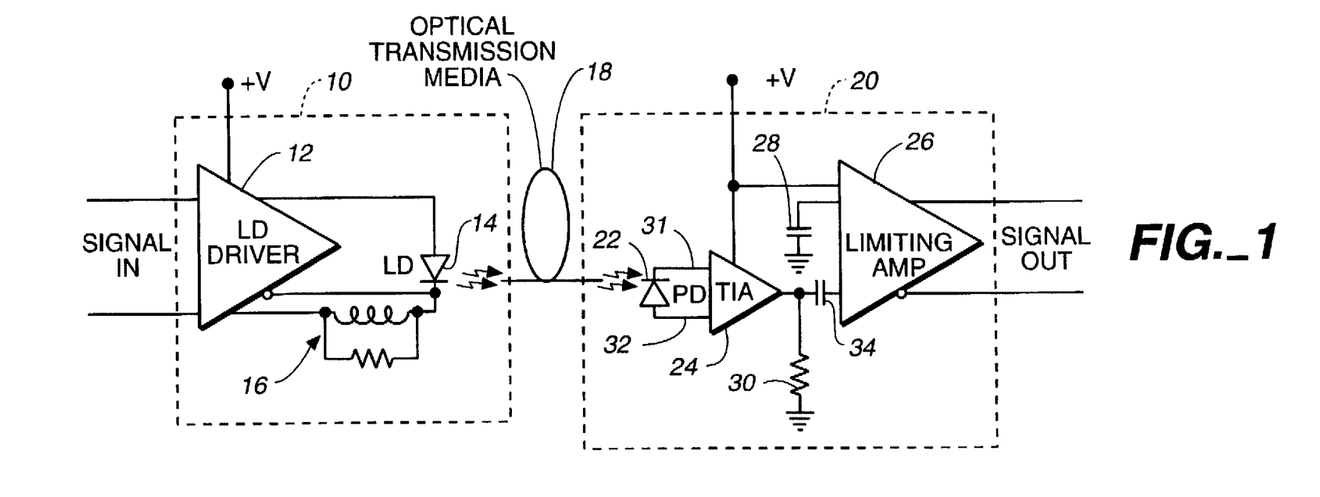
FIG. 1 is a schematic diagram of optical transmitter and optical receiver modules of this invention in an optical transmission system utilizing a fiber optic link.

Reference is now made to FIG. 1 which shows an optical transmitter/receiver module package for explaining the concept of this invention. Transmitter module 10 comprises laser diode (LD) driver 12 which receives an electrical data signal for driving optical source, e.g., laser diode (LD) 14. Optical source is preferably a laser diode but may also be a light emitting diode operating at a suitable data modulated rate. Driver 12 is a commercially available high speed laser driver chip. LD 14 comprises an uncooled, single stripe, InGaAs/GaAs quantum well laser operating nominally at a wavelength of 1 μm at room temperature. LD 14 is mounted on a submount which is then fixed to the transmitter module package. No thermoelectric cooler or other cooling means is provided. Circuit 16 provides DC bias for LD 14 and provides significant impedance to RF so that the RF differential signal drive does not interfere with the DC operation of the LD 14.

The output of LD 14 is coupled into an optical transmission medium, such as optical fiber 18, and the laser modulated data signal is transmitted to an optically coupled receiver module 20. Optical coupling of both modules to optical fiber are accomplished to accommodate high temperature operation of the optical transmission link, such as operational temperatures in excess of 80° C. The coupling materials employed have a thermal expansion coefficient substantially matching one another to minimize misalignment of the LD output and the PD input over a temperature range from room temperature and in excess of 80° C., up to at least 140° C. In particular, the output of LD 14 is aligned with a lensed end of the optical fiber. The optical fiber is held on its individual mount by means of metalization in a manner to minimize misalignment with the LD input. The metalization empl oyed is a high temperature solder which is molten at about 280° C. to 300° C. so that can withstand high temperature operation of the link while maintaining proper alignment with the LD output.

Optical transmission medium 18 may be an optical fiber or a semiconductor waveguide or other appropriate optical transmission medium. Optical fiber 18 may be short so that modules 10, 20 are placed in a transmission package that may function as an optical repeater or local optical communicator. Optical fiber 18 may be of long length for transmission of an. optical signal to a remote location, in which case, the transmission link may include an optical amplifier, such as a doped, optical fiber amplifier or provided with a pump laser optically coupled into medium 18. Medium 18 may be a single mode or multimode fiber and is coupled to modules 10 and 20 in a manner that is stable at high temperatures. Also, medium 18 may be a rear-earth doped double clad fiber particularly where the fiber is also to be laser pumped for gain enhancement of the transmitted optical signal.

Receiver module 20 comprises photodiode (PD) 22, the output of which is coupled via leads 31 and 32 to transimpedance amplifier (TIA) 24. DC bias for PD 22 is provided by a 1 kω resistor that is internal within transimpedance amplifier 24. Detector 22 may be a PIN diode, metal-semiconductor-metal (MSM) photodetector, avalanche photodiode (APD) or a Schottky photodiode. However, a Schottky photodiode is preferred, e.g., a high speed, rear illuminated InGaAs/InP Schottky photodiode. TIA 24 may be obtained commercially from Maxim Integrated Products, Inc. of Sunnyvale, Calif. 94086 and may have a nominal front end transimpedance of 2 kω and a nominal bandwidth of about 1 GHz or more. The output of TIA 24 is coupled to limiting post amplifier 26 via coupling capacitor 34 for DC signal isolation. Post amplifier 26 may be obtained commercially from Maxim Integrated Products, Inc. of Sunnyvale, Calif. 94086. The nominal bandwidth of limiting amplifier 26 may be about 925 MHz. The output of TIA 24 is terminated into 50 ω via resistor 30. Since the differential input of amplifier 26 is DC coupled, as shown, the unused signal input is grounded through capacitor 28.

Operation of the optical transmission link of FIG. 1 is as follows. An electrical voltage data signal to be transmitted is received at the signal input of transmitter module 10 as input to LD driver 12. LD driver 12 amplifies and modulates a current data signal to drive LD 14 according to an electrical data signal at its signal input. LD 14 produces a modulated optical data signal which is transmitted through optical transmission medium 18. Medium 18 could be optically pumped or amplified if required. Photodetector (PD) 22 receives the transmitted optical data signal and produces an electrical current signal replica of the transmitted optical signal. This signal is then amplified and converted by TIA 24 to produce a voltage output signal which is further amplified by limiting amplifier 26 to produce a voltage data output signal from receiver module 20 substantially comprising a replica of the original data input signal.

A particularly important aspect of this invention is an optical transmission link package comprising an optical transmitter module and an optical receiver module linked via an optical transmission medium as illustrated in FIG. 1, capable of operating uncooled, i.e., without any addition or requirement of cooling either LD 14 or PD 22 or any other components of the link. The design of LD 14 and the receiver module package have both been improved for high temperature operation and high frequency operating characteristics, e.g., operating CW in excess of 80° C. and tested to operate CW in excess of 125° C. and up to 140° C. without failure. The manner of achieving these characteristics is a threefold consideration of the quantum well structure of the laser device, the contacting employed for the laser, and the operating output power level. As to the first consideration, the employment of a MQW structure is required, i.e., at least two, if not more, quantum wells in the active region of the laser diode provides for better charge carrier control in the active region and corresponding higher permissible operation temperature. The quantum wells are lattice strained (In$_x$Ga$_{1-x}$As where x is greater than about 0.20) to increase the differential gain, to provide for high T$_O$, and lower the laser diode current threshold, I$_{th}$. The quantum wells are provided to be deep wells so that the electrons are strongly confined to the wells due to the use of high quantum well barriers as well as provide for the lower probability of thermionic emission. The conduction band barrier height is equal to or greater than 0.2 eV and the equivalent valance band height is about 0.1 eV. The use of two or more quantum wells in the laser diode permits lower current threshold and higher operating temperature, such as in excess of 80° C. operation.

Other factors to consider in connection with high frequency operation relative to barrier height for LD 14 are set forth in the article of R. Nagarajan et al, "Effect of the Confinement Layer Composition on the Internal Quantum Efficiency and Modulation Response of Quantum Well Lasers", *IEEE Photonics Technology Letters*, Vol. 4(8), pp. 832–834, August, 1992, which is incorporated herein by reference thereto.

The second consideration is the contacting of the laser diode. By reducing the area of metalization for at least one of the contacts of the laser diode, the operating characteristics are changed, i.e., the capacitance is lowered, so that LD 14 may be operated at higher frequencies, i.e., frequencies in excess of 1 GHz or data rate greater than 1 Gb/sec. LD 14 is provided with a bottom or n-side contact covering the bottom surface of the laser diode substrate. LD 14 is then mounted n-side down on a submount. The top or p-side contact, however, does not extend to the full extent of the top cap layer of the laser diode but rather is limited relative to the length and width of the laser stripe of LD 14. For example, the width of the laser stripe may about 3 μm and the metal ohmic contact with the cap layer may be about 20 μm wide or so. As a result, a capacitance of less than 10 pf and a resistance of less than 10 ω is achieved. If the metal ohmic contact is made smaller than this, it becomes more difficult to produce due to photolithography limitations and the resistance will also increase. If the metal ohmic contact is made larger than this, the area between the contacts is made larger resulting in larger capacitance limiting its frequency bandwidth of operation.

The third consideration is operating the laser diode at lower power levels, such as 10 mW to 50 mW, vis a vis, for example, operating levels of 150 mW or higher. While this is not always possible because of the power level requirements of particular applications, lower operating power levels will permit higher temperature operating characteristics, particularly as combined with the first and second above mentioned considerations. In cases requiring higher power levels, a solution is to transmit the modulated optical signal at lower power levels and provide the transmission medium 18 to have amplifying capabilities that are able to withstand higher operation temperature, i.e., in excess of 80° C., preferably in excess of 100° C. One such optical amplifier would be a doped optical fiber amplifier, such as a Yr$^{3+}$ or Nd$^{3+}$ doped optical fiber, as medium 18. In this case, LD 14 would be a multi-stripe, multiple wavelength device producing a series of wavelengths in a wavelength band wherein at least one of the output wavelengths of the laser diode, depending upon the environmental operational temperature of the optical transmission system, will fall within the amplification band of the doped optical fiber amplifier. Another such optical amplifier for medium 18 would the addition of a pump laser of the type similar to LD 14 which is optically coupled to a double clad optical fiber to amplify the modulated signal transmitted on medium 18.

Figure 7:
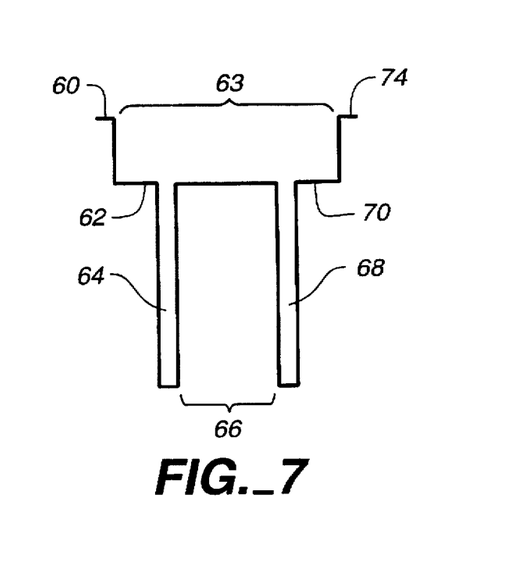
FIG. 7 is a schematic conduction band edge diagram of the laser diode source for the optical transmitter module according to a first embodiment of this invention.

FIGS. 7–10 show various conduction band edge diagrams for the layer structure for LD 14 grown by MOCVD. The active regions of all of these structures include at least two strained quantum wells to reduce the threshold current, provide for high T$_O$, and nominally provide a wavelength of 1 μm at room temperature. FIG. 7, shows a first embodiment for laser diode layer structure comprising cladding layer 60 which may be, for example, n-Al$_{0.40}$Ga$_{0.60}$As; confinement or waveguide layer 62 may be undoped GaAs (approximately 170 Å thick); active region 63 may comprise two undoped quantum wells 64, 68 of, for example, In$_{0.30}$Ga$_{0.70}$As (approximately 90 Å thick) separated by an undoped, comparatively thick barrier layer 66 of, for example, GaAs (approximately 300 Å thick); confinement or waveguide layer 70 may be undoped GaAs (approximately 170 Å thick); and outer cladding layer may be, for example, 74 p-Al$_{0.40}$Ga$_{0.60}$As. For high temperature operation, it is preferred that there be at least two quantum wells having a minimum quantum well depth of 0.2 eV (valance band 0.1 eV), the quantum wells separated by a comparatively large barrier to provide for a high level of carrier confinement.

An important component of this structure relative to this invention is the thickness of barrier layer 66, in particular, to its relationship to the quantum well thickness and level of strain. In the utilization of strained InGaAs quantum wells, it is preferred that the GaAs barrier 66, formed after the first strained InGaAs quantum well 64, have a thickness sufficiently large enough to permit the subsequent growth of the second strained InGaAs quantum well 68 to be of uniform growth in the MOCVD process. In MOCVD growth, strained InGaAs has a tendency to grow with a non-planar surface. Therefore, to grow multiple uniform well structures of uniform thickness, it is preferred that barrier 66 be made sufficiently large to regain planarity in layer growth before commencing growth of the second well. Without planar growth, the quantum well pair will not be of uniform planar thickness thereby affecting the uniformity in gain properties and increasing the laser threshold. In the particular case of strained double quantum wells, the barrier should be approximately two times thicker, or more, than the thickness of one of the quantum wells, and each quantum well thickness should be less than the critical thickness of a quantum well layer for the given Group III–V material in the absence of, i.e., the lack of presence of, any other quantum wells. This critical thickness for a InGaAs quantum well layer is set forth in FIG. 3-1 on page 69 and pages 67–70, Chapter 3, "Strain Effects on Quantum Well Lasers" of the Ph.D. dissertation of Julian S. Osinski entitled, "Analysis, Design, and Fabrication of Low Threshold Semiconductor Lasers Using Compressively Strained Quantum Wells", May 1992, which FIG. 3-1 and pages 67–70 are incorporated herein by reference thereto. FIG. 3-1 shows critical thickness for a single InGaAs layer buried in GaAs employing the Matthews-Blakeslee model and FIG. 3-2 shows critical thickness for a single InGaAs layer buried in InP employing the Matthews-Blakeslee model. So then, if the barrier thickness is sufficiently thicker than the thickness of the quantum well, i.e. functioning like a "substrate" relative to the very thin quantum well layer, no defects will occur in MOCVD growth of these layers in the active region, which may approximately two times or more of the thickness of the quantum well, and if the thickness of the quantum well layers does not exceed the critical thickness. In the case here, the thickness of 90 Å for quantum wells 64, 68 at a composition of In$_{0.30}$Ga$_{0.70}$As is close to a nominal wavelength of about 1 μm at room temperature and is less than the critical thickness in the absence of the second quantum well. However, if the quantum wells were separated by less than or approximately equal to their thickness, the two combined, closely spaced wells would exceed the critical thickness and defects would occur. Therefore, barrier layer growth should be of sufficient thickness to maintain planar uniformity and thickness of the quantum wells.

In summary, barrier 66 should have a thickness sufficiently large so that strain produced by the quantum wells will be somewhat relieved and the entire structure remains below the critical thickness limit. In the particular case here, if two 90 Å thick quantum wells were spaced 180 Å–350 Å apart, this would exceed the critical thickness for defect formation for the given Indium concentration in the InGaAs wells. In this case, a barrier thickness in excess of about 150 Å insures defect free operation of the device. In addition, the thick barrier aids in uniform growth of the second quantum well. Furthermore, barrier 66 has a maximum thickness limit such that optical confinement will not be too low, i.e., the overlap factor between the propagating optical mode in the laser cavity and the active region is still maintained so that it will have a sufficiently low threshold current for the laser diode to lase. An optical overlap of approximately 1% or more is desired and is aided by the multiple quantum well structure compared to a single quantum well design.

Figure 8:
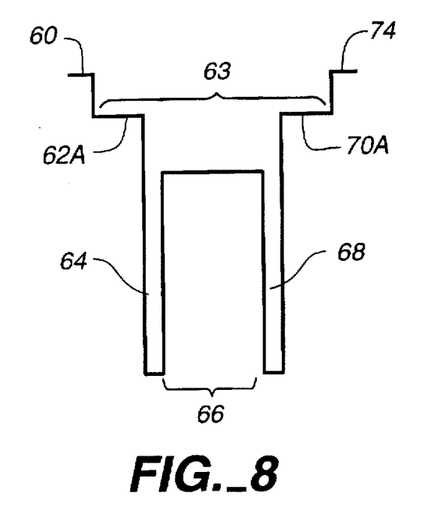
FIG. 8 is a schematic conduction band edge diagram of the laser diode source for the optical transmitter module according to a second embodiment of this invention.

FIG. 8 shows a second embodiment for laser diode layer structure conduction band edge diagram for the layer structure for LD 14. In this embodiment, there are no confinement layers 62 and 70, instead there are high confinement layers 62A and 70A of AlGaAs formed between cladding layers 60 and 74 and quantum wells 64 and 68. High confinement layers 62A and 70A are partially doped, i.e., they are doped approximately half of their thickness (n-AlGaAs and p-AlGaAs) from their respective adjacent cladding layers 60 and 74.

Figure 9:
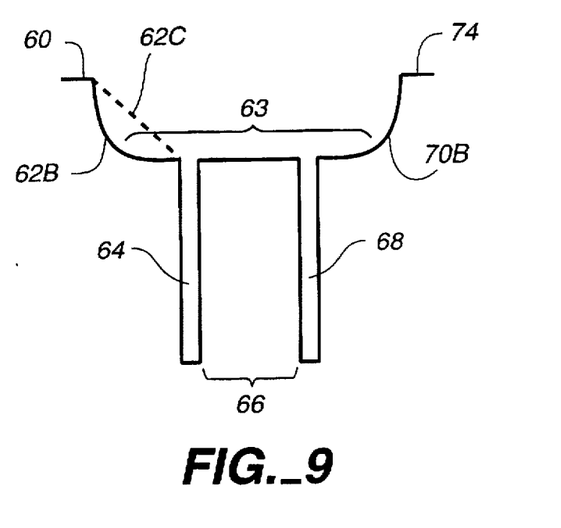
FIG. 9 is a schematic conduction band edge diagram of the laser diode source for the optical transmitter module according to a third embodiment of this invention.

FIG. 9 shows a third embodiment for laser diode layer structure conduction band edge diagram for the layer structure for LD 14. In this embodiment, the confinement layers 62B and 70B are index graded to be parabolically increasing in refractive index from GaAs adjacent to wells 64, 68 with increasing Al content, forming n- or p- AlGaAs until the content of Al for cladding layers 60, 74 is achieved, e.g., $Al_{0.40}Ga_{0.60}As$. Alternatively, confinement layers 62B and 70B can be index graded linearly as indicated by dotted line 62C. Confinement layers 62B, 62C, 70B are partially doped, i.e., they are doped approximately half of their thickness (n-AlGaAs and p-AlGaAs) from their respective adjacent cladding layers 60 and 74.

Figure 10:
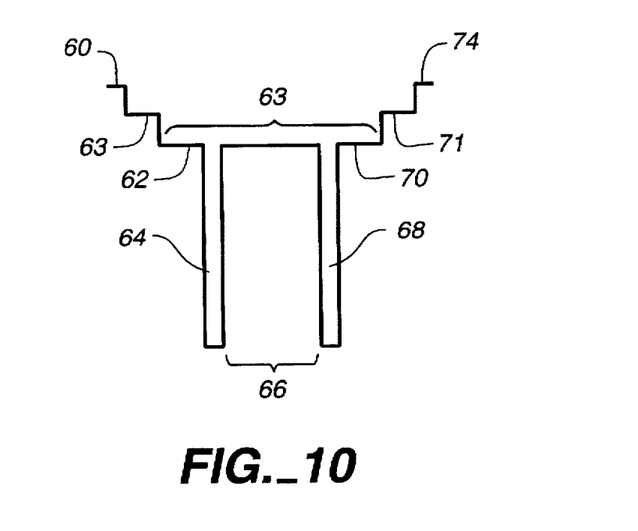
FIG. 10 is a schematic conduction band edge diagram of the laser diode source for the optical transmitter module according to a fourth embodiment of this invention.

FIG. 10 shows a fourth embodiment for laser diode layer structure conduction band edge diagram for the layer structure for LD 14. In this embodiment, a multiple step graded index may be provided in the cladding layers adjacent undoped confinement layers 62 and 70. In FIG. 10, two such steps are illustrated, although additional smaller decremental index stepping may be utilized. Cladding layers 63 and 71 are partially doped, i.e., they are doped approximately half of their thickness (n-AlGaAs and p-AlGaAs) from their respective adjacent outer cladding layers 60 and 74.

In all of the embodiments of FIGS. 7–10, asymmetric cladding layers 60, 74 (cladding layers 63, 71 in FIG. 10) may be employed to shaped or offset the propagating optical mode. An example of asymmetric cladding layers is illustrated in the article of R. Nagarajan et al. entitled, "Experimental Evidence for Hole Transport Limited Intensity Modulation Response in Quantum Well Lasers", *Electronics Letters*, Vol. 29 (19), pp. 1688–1689, Sept. 17, 1993, which is incorporated herein by reference thereto.

Figure 6:
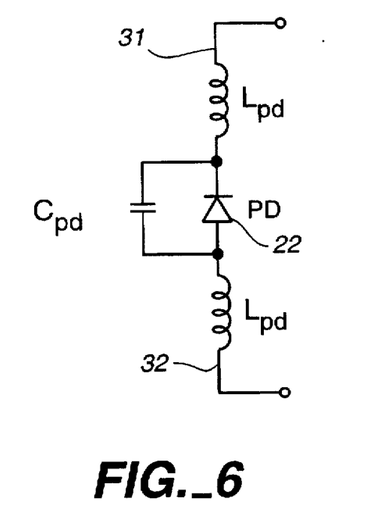

As previously indicated, receiver module 20 is an important component in the data communication link since this is where noise has the greatest detrimental effect due, in large part, to the presence of laser noise and development of additional white noise at the front end of the receiver. The circuit parasitic elements affect the bandwidth properties and the response time of PD 22. FIG. 6 illustrates an equivalent circuit for PD 22 as connected to TIA 24. The performance of PD 22 is determined, in part, by the inductance, $L_{pd}$, of the parasitic elements comprising the electrical lead connection between PD 22 and TIA 24. This lead connection is generally accomplished by employing bond wires or a conductive ribbon. The use of a conductive ribbon provides for lower inductance compared to lead wires. Also, there is the junction and connection capacitance, $C_{pd}$, relative to the two bond wires connected to TIA 24. The inductive values, $L_{pd}$, can be optimized by computer analysis or through mathematical evaluation as discussed in U.S. pat. No. 4,959,535, which is incorporated herein by reference thereto. Also, these inductive values can be optimized by a trial-and-error method. In particular, the length of these bond wires is selectively increased to optimize the inductance value, $L_{pd}$, and provide for a reduction of the noise over the effective bandwidth of the combination of both PD 22 and TIA 24.

Figure 4:
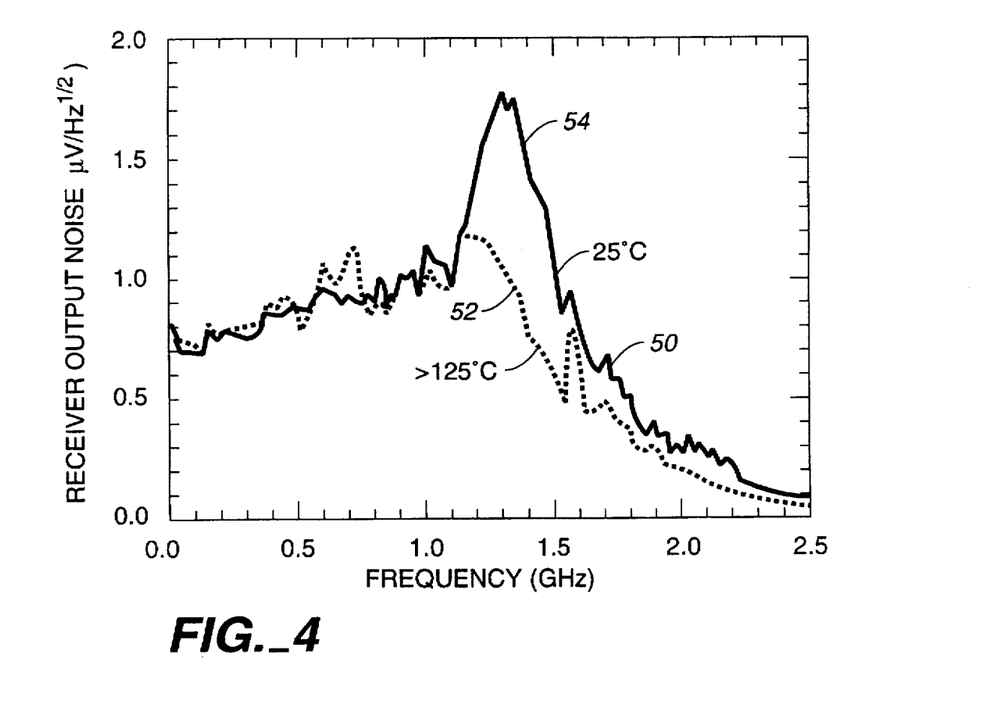
FIG. 4 is a graphic illustration of the noise at the output of the optical receiver module over its frequency bandwidth (receiver output noise versus frequency bandwidth).

The optimization of the inductance value, $L_{pd}$, is of particular importance in this invention in providing an uncooled optical transmission link package that can be operated over a wide operating temperature range with reduced noise improving the receiver SNR performance over the temperature operating range while providing a wide signal bandwidth at the output of TIA 24. The operating temperature range of the package shown in FIG. 1 is from at least −15° C. to at least 140° C. with the receiver SNR performance remaining substantially constant. This operation is illustrated in FIG. 4 showing receiver output module noise versus frequency bandwidth. Two curves are shown in FIG. 4, one curve 50 when receiver module 20 is operating at room temperature of about 25° C. (solid line curve) and another curve 52 when receiver module 20 is operating at or above 125° C. (dotted line curve). The noise in the receiver output is represented by the integration of the area or region under either of these curves.

Figure 5:
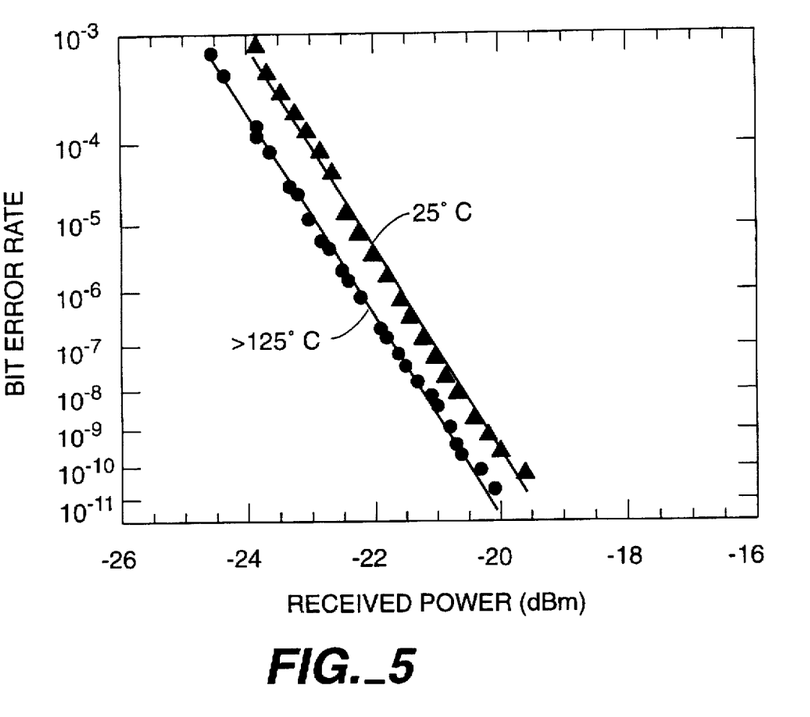
FIG. 5 is a graphic illustration of sensitivity curves (bit rate error versus received power) of the fiber optic link of FIG. 1 operating, respectively, at 25° C. and 125° C. at a predetermined high frequency data rate.

Results in operation of the coupled optical transmission link shown in FIG. 1 are as follows. The high temperature transmitter eye diagram (not shown) demonstrated optical power at the logic '1' level to be 3.9 mW and at the logic '0' level to be 0.4 mW with a pulse rise time of about 210 psec. and a falltime of about 250 psec. This signal swing of 3.5 mW is very large for a laser diode operating uncooled at junction temperatures which exceed 130° C. Sensitivity measurements of receiver module output have been done at a data rate of 1.2 Gbits/sec. The results are shown in FIG. 5. For a bit error rate (BER) of $10^{-9}$, a sensitivity of −20.8 dBm is shown at temperatures in excess of 125° C. and a sensitivity of −20.3 dBm at a temperature of 25° C. At first impression, the 0.5 dB penalty for operating at a lower temperature of 25° C.compared with operating temperatures at or in excess of 125° C. may appear to be somewhat of an anomaly. The reason for this is apparent from FIG. 4 showing noise at the receiver module output at these two particular temperature regimes. Since the dark current noise contribution of PD 22 is minimal, the receiver output noise is largely noise from TIA 24 amplified by limiting post amplifier 26. The output signal from TIA 24 is not filtered so that the bandwidth of receiver module 24 is determined by the bandwidth of the combination of PD 22 and both amplifiers 24 and 26. As can be seen, the bandwidth is larger at lower temperatures and the total noise contribution is correspondingly higher. In fact, the bandwidth at the higher temperature regime around 125° C. is closer to optimum for receiver module 20 at the data rate of 1.2 GBits/sec.

Figure 2:
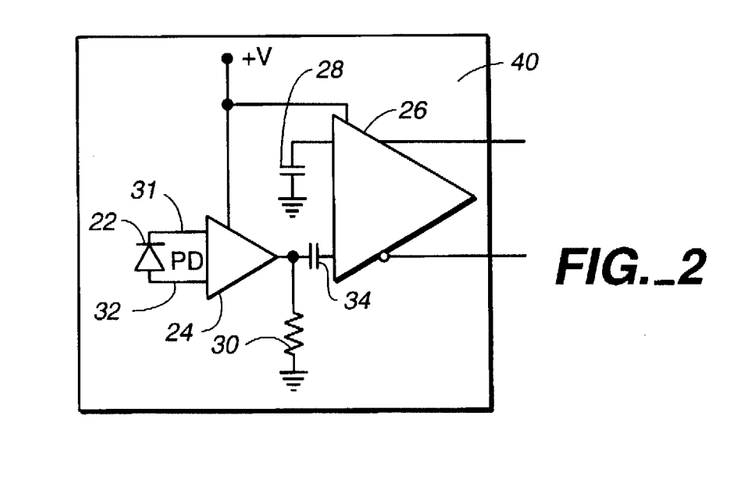
FIG. 2 is a schematic diagram of a first alternate form of a optical receiver module comprising this invention.

Another aspect of this invention is a second embodiment illustrated in FIG. 2 where the receiver module 20 may also be provided with a heater 40 as part of the receiver module to obtain temperature compensation of receiver performance. Heater 40 may be a heating plate of other such heater component attached to the receiver module. In addition, a thermistor or thermocouple (not shown) may be provided within the receiver module package to monitor the temperature of the receiver via a control circuit. The purpose of heater 40 is to optimize the operation of receiver module 20 to have the lowest possible receiver noise through the combination of both adjusting the length of bond wires 31 and 33 and the increasing of the environmental temperature of operation of receiver module 20 to provide the lowest receiver output noise over its operable bandwidth and, correspondingly, increase the sensitivity of the receiver. Where the packing constraints are such that the parasitic elements, such as the bond wires from the PD 22, cannot be further reduced to decrease the receiver noise, heat may be applied to receiver module 20 to reduce further the noise over the receiver output bandwidth, i.e., noise bandwidth reduction is achieved at higher temperatures to improve SNR performance of the receiver module. By operating heater 40 to provide a temperature operational regime of about 125° C. or above, the noise over the bandwidth of operation of the receiver is reduced, as shown in FIG. 4, particularly by the elimination of peak 54, so that the SNR performance of the receiver over its response frequency bandwidth can be optimized by using heater 40 to select the optimum operating temperature for providing the lowest level of receiver noise.

Figure 3:
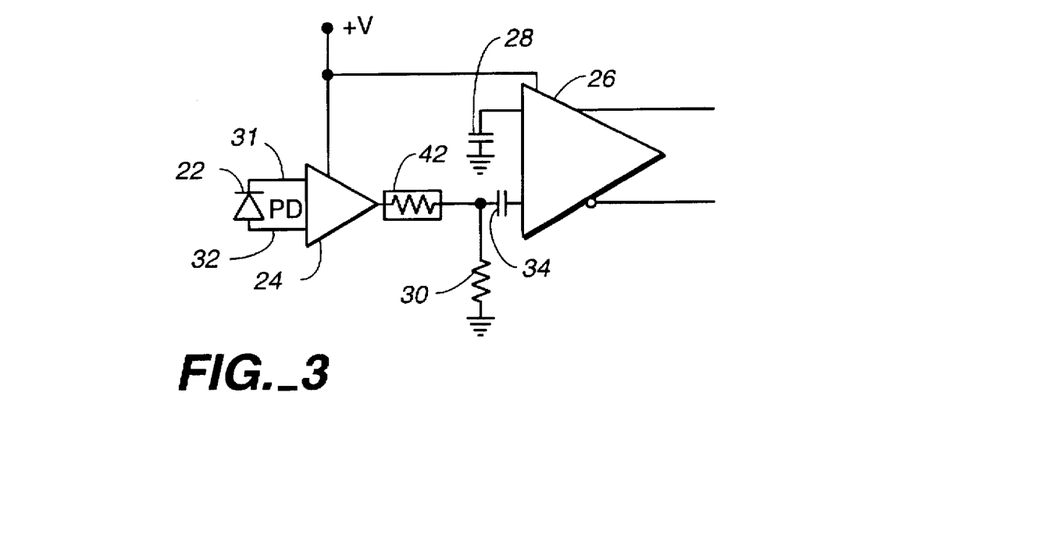
FIG. 3 is a schematic diagram of a second alternate form of a optical receiver module comprising this invention.

Another aspect of this invention is a third embodiment illustrated in FIG. 3, where the receiver module 20 may also be provided with a thermistor or temperature variable attenuator 42 or other such temperature dependent resistance device to obtain temperature compensation of receiver performance. An example of such a device is a temperature variable attenuator available from EMC Technology, Inc. of Cherry Hill, N.J. which has low to high frequency capacity, such as up to 6 GHz. As the temperature rises in receiver module 20, the resistance or attenuation tion of device 42 drops and the signal level from the output of TIA 24 improves so as to compensate for the corresponding drop in gain typically experienced by receiver amplifiers operating at higher temperatures. This approach differs from the second embodiment where changes are made in the overall frequency response curve by reducing front end noise whereas here the frequency response gain level is changed which correspondingly increases or extends the frequency bandwidth response of the receiver module.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications that are within the spirit and scope of the following claims.

What is claimed is:

1. An optical transmission link comprising a transmitter module and a receiver module optically coupled by an optical transmission medium, said transmitter module comprising a laser diode source for providing an optical sianal outnut to said medium, said source characterized by having a low threshold to Permit operation at temperatures in excess of about 100° C. without applied cooling and without significant changes in the operating wavelength bandwidth of said source over a wide temperature operating range, said low threshold provided, at least in part, by said source having an active region with at least two strained quantum wells with deep quantum wells and high quantum barriers for enhanced-charge ronfinement in the active region; and said receiver module comprising a compensator to adjust the temperature of the receiver module to optimize for lowest noise level over the operating bandwidth of the receiver nodule over a wide temperature operating range.

2. The optical transmission link of claim 1 wherein said strained quantum wells have a conduction band barrier height equal to or in excess of 0.2 eV.

3. The optical transmission link of claim 1 wherein said receiver module includes a photodiode as an optical signal input for said medium, the output of said diode connected as an input to a transimpedance amplifier, noise bandwidth controlled by wire connection of said photodiode to said transimpedance amplifier minimized by adjusting the length of the wire connection therebetween.

4. The optical transmission link of claim 3 wherein said photodiode comprises a Schottky photodiode.

5. An optical transmission link comprising:
a single transverse mode semiconductor laser diode having an active region comprising strained multiple quantum wells and barrier layers providing at least 0.2 eV of carrier confinement for said active region to provide for both high $T_0$ and lower laser diode threshold at high operating temperatures;

a driving circuit for modulating said laser diode;

at least one contact to said laser in said circuit minimized in its area of contact to said laser diode to reduce the RC time constant of said driving circuit to permit high frequency modulation of said laser diode source in excess of 1 Gb/sec;

the combined effect of the multiple quantum wells and area minimized laser contacting eliminating the need for any applied cooling to the optical transmission link at tempneratures in excess of about 100° C.

6. The optical transmission link of claim 5 wherein said strained multiple quantum well active region comprises at least two quantum wells.

7. The optical transmission link of claim 6 wherein said quantum wells are comprise of InGaAs wherein the In is greater than 20%.

8. The optical transmission link of claim 5 wherein said contact means comprises at least one conductive contact having a reduced size to reduce the capacitance and resistance, respectively to less than 10 pf and 10 ω.

9. In an optical transmission link, a transmitter module comprising:

a laser diode source;

a circuit driver for driving said laser diode to produce a signal output;

a modulator for modulating said circuit driver for intensity modulation of the source output according to the data to be transmitted over the optical transmission link;

an optical fiber amplifier optically coupled to receive the modulated output of said source, the output from said optical fiber amplifier coupled to an optical transmission medium of the optical transmission link;

the improvement comprising operating said laser diode source at a low power level to permit said source to operate at temperatures in excess of 100° C. and at baud rates in excess of 1 Gbit/sec without any applied cooling, said coupled optical fiber amplifier providing for higher power levels for transmission of the intensity modulated data.

10. In the optical transmission link of claim 9 wherein said laser diode source has at least two strained quantum wells in its active region to provide deep quantum wells and high quantum barriers.

11. In the optical transmission link of claim 10 wherein the electrical contacting of said laser diode source relative to said circuit driver is reduced in area of contact to reduce its capacitance therein.

12. In the optical transmission link of claim 9 wherein said laser diode source is operated at a power level of about 50 mW or less and said optical fiber amplifier provides an output power level in excess of 100 mW.

* * * * *

UNITED STATES PATENT AND TRADEMARK OFFICE
CERTIFICATE OF CORRECTION

PATENT NO. : 5,760,939
DATED : June 2, 1998
INVENTOR(S) : Radhakrishnan Nagarajan and Jo S. Major, Jr.

It is certified that error appears in the above-identified patent and that said Letters Patent is hereby corrected as shown below:

On the title page of the patent, "References Cited", "U.S. PATENT DOCUMENTS", the following U.S. Patent Documents should be added:
4,034,296  7/5/77   Berenson et al., 644,797
4,438,348  3/20/84  Casper et al., 949,231
4,817,208  3/28/89  Koch et al., 94,185
4,959,535  9/25/90  Garrett 418,976
5,055,799  10/8/91  Calton 398,286
5,010,588  4/23/91  Gimlett 318,844
5,113,524  5/12/92  Hirota et al., 412,510
5,181,215  1/19/93  Sam et al., 796,147
5,345,459  9/6/94   Richardson et al., 118,273
5,357,363  10/18/94 Li et al., 126,131
5,373,152  12/13/94 Domon et al., 5,594
5,373,383  12/13/94 LaGasse 25,153
5,416,626  5/16/95  Taylor 189, 049
5,422,972  6/6/95   Chambers et al., 148,382

On the title page of the patent, "OTHER PUBLICATIONS" the following publications should be added:
(1) Zah, "High-Performance Uncooled 1.3-micron AlxGayIn1-x-yAs/InP Strained-Layer Quantum-Well Lasers for Subscriber Loop Applications", IEEE Journal of Quantum Electronics, Vol. 30, No. 2,
Feb. 1994, pp. 511-523
(2) Stegmuller et al., "High Temperature (130 degrees C) CW Operation of 1.53 Micron In GaAsP Ridge Waveguide Laser Using Strained Quaternary Quantum Wells:, Electronic Letters, Vol. 29, No. 19, pp. 1691-1693
(3) Nering "Uncooled Laser Transmitter Maintains High performance" Laser Focus World, Vol. 28, No. 10., Oct. 1997, p 85 et seq.,

UNITED STATES PATENT AND TRADEMARK OFFICE
CERTIFICATE OF CORRECTION

PATENT NO. : 5,760,939

DATED : June 2, 1998

INVENTOR(S) : Radhakrishnan Nagarajan and Jo S. Major, Jr.

It is certified that error appears in the above-identified patent and that said Letters Patent is hereby corrected as shown below:

(4) Ganichev et al., "Fast Uncooled Detector for Far-IR and Submillmeter Laser Beams", Soviet Technical Physics Letters, Vol. 11, No. 8, pp. 377-378

(5) Bogdankevich et al., "Uncooled Pulsed Zinc Oxide Semiconductor Laser", Soviet Technical Physics Letters, Vol. 11, No. 2, pp. 54-55

(6) Benditskii, "High-Speed Uncooled Infrared Deector", All-Union Scientific-Research Institute of Opticophysical Measurements, Moscow. Translated from Pribory i Tekhnika Eksperimenta, No. 4, pp. 182-183, July-August, 1986, pp. 95-957

(7) Derry et al., "Low Threshold Current High-Temperature Operation of InGaAs/AlGaAS Strained-Quantum-Well Lasers", IEEE Photonics Technology Letters, Vol. 4, No. 11, Nov. 1992, pp. 1189-1191

(8) Dissertation of Julian S. Osinski, "Analysis, Design and Fabrication of Low Threshold Semiconductor lasers Using Compressively Strained Quantum Wells", University of Southern California, May, 1992, pp. 67-70

(9) Nagarajan et al., "effect of the Confinement-Layer Composition on the Internal Quantum Efficiency and Modulation Response of Quantum-Well Lasers", IEEE Photonics Technology Letters, Vol. 4, No. 8, August 1992, pp. 832-834

(10) Nagarajan et al., "Experimental Evidence for Hole Transport Limited Intensity Modulation Response in Quantum Well Lasers", Electronics Letters, Vol. 29, No. 19, Sept. 17, 1993, pp. 1688-1689

(11) Mazzochette, "Temperature Variable Microwave Attenuators", Microwave Journal, March, 1992, pp. 122-123

UNITED STATES PATENT AND TRADEMARK OFFICE
CERTIFICATE OF CORRECTION

PATENT NO. : 5,760,939
DATED : June 2, 1998
INVENTOR(S) : Radhakrishnan Nagarajan and Jo S. Major, Jr.

It is certified that error appears in the above-identified patent and that said Letters Patent is hereby corrected as shown below:

(12) Yoshida et al., "Kink-Free High-Fiber-Coupled-Power 0.98-micron Narrow-Beam Lasers", OFC '95 Technical Digest, ThC, May, 1995, pp. 231-235
(13) Welch et al., "Gain Characteristics of Strained Quantum Well Lasers:, Applied Physics Letters, Vol. 56, No. 1, Jan. 1990, pp. 10-12
(14) Bour et al., "Improving the Performance of Strained InGaAs/AlGaAS Single Quantum Well Lasers", Applied Physics Letters, Vol. 56, No. 4, Jan. 22, 1990, pp. 318-320

Signed and Sealed this

Eleventh Day of April, 2000

Attest:

Q. TODD DICKINSON

Attesting Officer

*Director of Patents and Trademarks*